(12) United States Patent
Wu et al.

(10) Patent No.: US 11,011,357 B2
(45) Date of Patent: May 18, 2021

(54) METHODS AND APPARATUS FOR MULTI-CATHODE SUBSTRATE PROCESSING

(71) Applicant: APPLIED MATERIALS, INC., Santa Clara, CA (US)

(72) Inventors: Hanbing Wu, Millbrae, CA (US);
Anantha K. Subramani, San Jose, CA (US); Ashish Goel, Bangalore (IN);
Xiaodong Wang, San Jose, CA (US);
Wei W. Wang, Santa Clara, CA (US);
Rongjun Wang, Dublin, CA (US); Chi Hong Ching, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 378 days.

(21) Appl. No.: 15/890,694

(22) Filed: Feb. 7, 2018

(65) Prior Publication Data
US 2018/0240655 A1    Aug. 23, 2018

Related U.S. Application Data

(60) Provisional application No. 62/461,749, filed on Feb. 21, 2017.

(51) Int. Cl.
*H01J 37/34* (2006.01)
*H01L 43/12* (2006.01)
(Continued)

(52) U.S. Cl.
CPC .... *H01J 37/3441* (2013.01); *H01J 37/32651* (2013.01); *H01J 37/3429* (2013.01);
(Continued)

(58) Field of Classification Search
CPC .. H01J 37/32651; H01J 37/3447; H01J 61/10; H01J 37/3429
See application file for complete search history.

(56) References Cited

U.S. PATENT DOCUMENTS

| | | | | |
|---|---|---|---|---|
| 4,385,979 A | * | 5/1983 | Pierce | H01J 37/3405 204/298.09 |
| 6,432,203 B1 | * | 8/2002 | Black | C23C 14/564 118/504 |

(Continued)

FOREIGN PATENT DOCUMENTS

| | | |
|---|---|---|
| JP | 2003282381 A | 10/2003 |
| JP | 2005-195348 A | 7/2005 |
| JP | 2010-128789 A | 6/2010 |

OTHER PUBLICATIONS

International Search Report and Written Opinion dated May 30, 2018 received for Application No. PCT/US2018/018606.
(Continued)

*Primary Examiner* — Jason Berman
(74) *Attorney, Agent, or Firm* — Moser Taboada

(57) ABSTRACT

Methods and apparatus for processing substrates with a multi-cathode chamber. The multi-cathode chamber includes a shield with a plurality of holes and a plurality of shunts. The shield is rotatable to orient the holes and shunts with a plurality of cathodes located above the shield. The shunts interact with magnets from the cathodes to prevent interference during processing. The shield can be raised and lowered to adjust gapping between a target of a cathode and a hole to provide a dark space during processing.

20 Claims, 6 Drawing Sheets

(51) Int. Cl.
  *H01J 37/32*   (2006.01)
  *H01J 61/10*   (2006.01)
  *H01L 43/08*   (2006.01)
  *H01L 43/10*   (2006.01)

(52) U.S. Cl.
  CPC .......... *H01J 37/3447* (2013.01); *H01J 61/10* (2013.01); *H01J 43/12* (2013.01); *H01L 43/08* (2013.01); *H01L 43/10* (2013.01)

(56) References Cited

U.S. PATENT DOCUMENTS

| | | | |
|---|---|---|---|
| 2004/0026233 A1* | 2/2004 | Perrin ................ | H01J 37/3405 204/192.12 |
| 2006/0231392 A1 | 10/2006 | Mullapudi et al. | |
| 2011/0100552 A1 | 5/2011 | Dhindsa et al. | |
| 2012/0164354 A1 | 6/2012 | Otani et al. | |
| 2013/0048494 A1 | 2/2013 | Kikuchii et al. | |
| 2014/0102889 A1 | 4/2014 | Kajihara et al. | |
| 2014/0272684 A1 | 9/2014 | Hofmanni et al. | |
| 2014/0374250 A1 | 12/2014 | Ishihara | |
| 2015/0279635 A1 | 10/2015 | Subramani et al. | |
| 2017/0178877 A1* | 6/2017 | Wang ................ | C23C 14/3407 |

OTHER PUBLICATIONS

Supplementary European Search Report for EP 18756691, dated Sep. 28, 2020.

* cited by examiner

METHODS AND APPARATUS FOR MULTI-CATHODE SUBSTRATE PROCESSING

CROSS-REFERENCE TO RELATED APPLICATIONS

This application claims benefit of U.S. provisional patent application Ser. No. 62/461,749, filed Feb. 21, 2017, which is herein incorporated by reference in its entirety.

FIELD

Embodiments of the present principles generally relate to substrate process chambers used in semiconductor manufacturing systems.

BACKGROUND

Sputtering, also known as physical vapor deposition (PVD), is a method of forming features in integrated circuits. Sputtering deposits a material layer on a substrate. A source material, such as a target, is bombarded by ions strongly accelerated by an electric field. The bombardment ejects material from the target, and the material then deposits on the substrate. During deposition, ejected particles may travel in varying directions, rather than generally orthogonal to the substrate surface, undesirably resulting in producing a layer of the source material on the inner structure of a process chamber.

The unwanted coating of the inner structure, such as on a shield or other inner surfaces of the process chamber, may cause defects and contamination in subsequent wafer processing. Contamination occurs when material from the unwanted coating combines with a desired material being deposited onto a wafer. The resulting wafer deposition film will be a mixture of the deposition material and the material from the coating of the inner structure. Defects in the wafer processing occur when particles from the unwanted coating fall into the deposition layer on the wafer. The wafer surface can be inspected to determine the quantity and size of the defects, but the wafer deposition film must be analyzed to determine the film's composition.

Direct current (DC) powered PVD chambers are typically used for metal wafer deposition processes because of their cost effectiveness and efficiency. However, when used with a dielectric material, the dielectric material eventually covers the electrodes within the chamber with an insulating film, halting the deposition process. Alternating current (AC) powered PVD chambers, such as Radio Frequency (RF) PVD chambers, have the ability to neutralize positive charges left on surfaces in the first half of the cycle with negative charges during the second half of the cycle. The cyclic nature allows RF PVD chambers to be used for both metal and dielectric wafer depositions, but with a lower deposition rate than DC powered PVD chambers.

Magnetic random access memory (MRAM) requires a barrier layer to be constructed as part of the memory device. The barrier layer must have high purity and low defect numbers to operate correctly. Magnesium oxide (MgO) is a dielectric material that can be utilized as a barrier layer. However, using RF power to deposit MgO on substrate surfaces inherently leads to poor defect performance.

Thus, the inventors have provided an improved method and apparatus for PVD deposition of dielectric materials.

SUMMARY

Methods and apparatus for processing a substrate are disclosed herein. In some embodiments, a process chamber includes a chamber body defining an interior volume, a substrate support to support a substrate within the interior volume, a plurality of cathodes coupled to the chamber body and having a plurality of targets, and a shield rotatably coupled to an upper portion of the chamber body and having at least one hole to expose at least one of the plurality of targets to be sputtered in a process and at least one shunt disposed in a topside of the shield to accommodate and shield at least another one of the plurality of targets not to be sputtered in the process, wherein the shield is configured to rotate about and linearly move along a central axis of the process chamber.

In some embodiments, the process chamber can further include wherein the plurality of cathodes includes three RF cathodes and three DC cathodes, the plurality of targets are disposed parallel to the substrate support, the plurality of targets include six targets, the six targets include three dielectric targets and three metallic targets, the shield includes three non-adjacent holes, the six targets include two adjacent dielectric targets, two adjacent first metallic targets formed of a first metal, and two adjacent second metallic targets formed of a second metal, the shield includes at least two adjacent holes, a chamber body adapter coupled to an upper portion of the chamber body wherein the chamber body adapter is grounded and a plurality of grounding loops with compliant contact surfaces disposed between the shield and the chamber body adapter to ground the shield.

In some embodiments, a process chamber includes a chamber body defining an interior volume, a chamber body adapter coupled to an upper portion of the chamber body, wherein the chamber body adapter is grounded, a substrate support to support a substrate within the interior volume, a plurality of cathodes coupled the chamber body adapter and having a plurality of targets, a shield rotatably coupled to the chamber body adapter and having at least one hole to expose at least one of the plurality of targets being sputtered in a process and at least one shunt to accommodate at least another one of the plurality of targets not being sputtered in the process, wherein the shield is configured to rotate about and linearly move along a central axis of the process chamber, and a plurality of grounding loops with compliant contact surfaces disposed between the shield and the chamber body adapter to ground the shield, wherein the plurality of targets includes at least one dielectric target and at least one metallic target.

In some embodiments the process chamber further includes wherein the plurality of targets is disposed parallel to the substrate support, the plurality of targets includes six targets, wherein the six targets include three dielectric targets and three metallic targets, the shield includes three non-adjacent holes, the six targets include two adjacent dielectric targets, two adjacent first metallic targets formed of a first metal, and two adjacent second metallic targets formed of a second metal, the shield includes two adjacent holes, the shunt is made of a material based on Mu-metal or stainless steel.

In some embodiments, an apparatus for processing substrates in a process chamber includes a shield configurable to be rotatably coupled to a chamber body of the process chamber, the shield having at least one hole to expose at least one of a plurality of targets to be sputtered and at least one shunt to shield at least one of a plurality of targets not to be sputtered, wherein the shield is configurable to rotate about and linearly move along a central axis of the process chamber. In some embodiments the apparatus can further include wherein the shield has a mounting arm that supports the at least one shunt and the mounting arm is removable from the shield.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
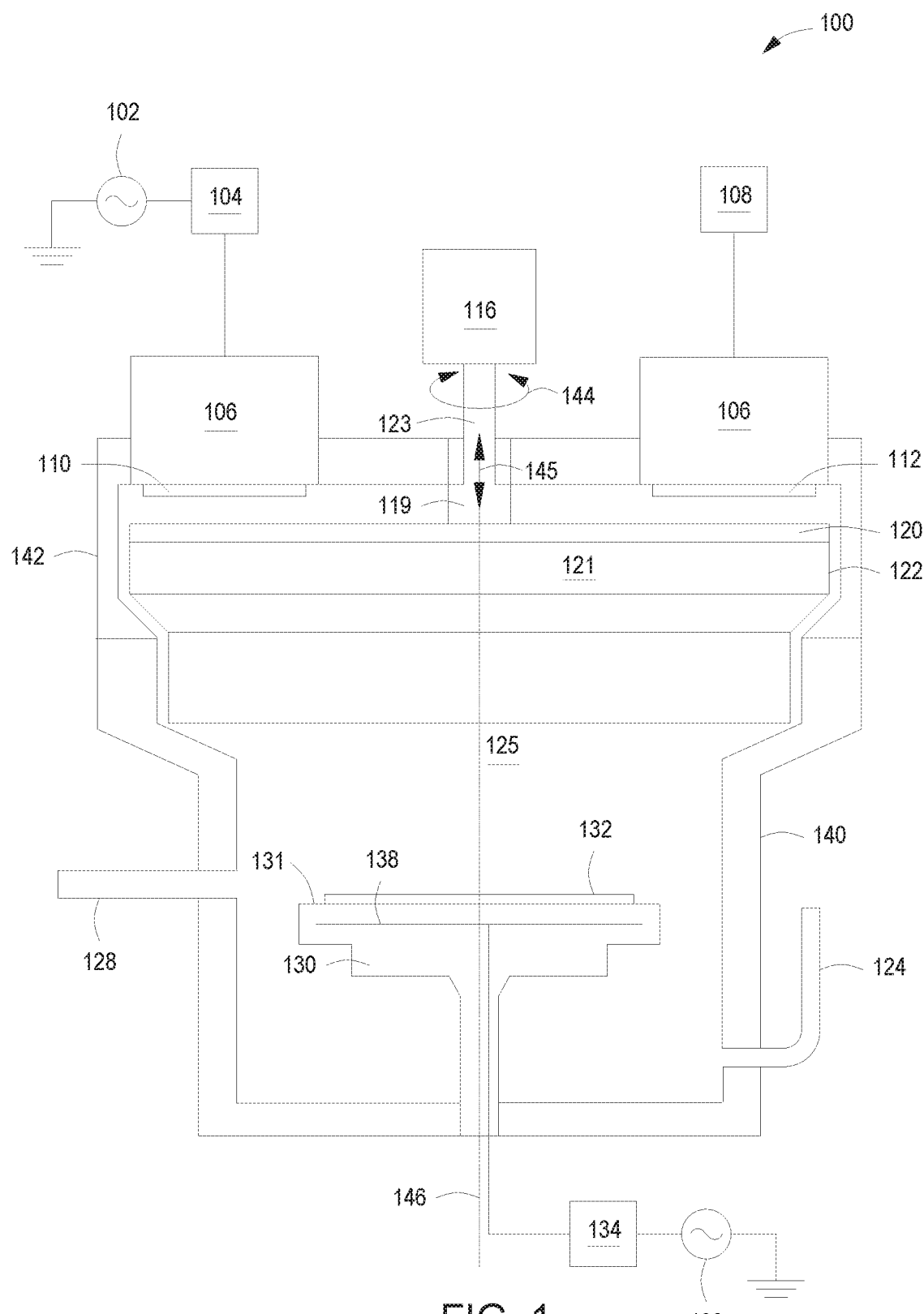
FIG. 1 depicts a schematic view of a multiple cathode processing chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for improved substrate processing performance are provided herein. The disclosed methods and apparatus may advantageously reduce wafer defects caused by particles, improve uniformity of a wafer film, and provide improved RF grounding for a rotatable shield. The embodiments are especially advantageous when utilizing RF power for dielectric films, significantly improving defect performance and film uniformity. In some embodiments, a symmetric three RF by three DC (3×3) powered configuration enables approximately 1% tunnel magnetoresistance (TMR) for MRAM applications and less than approximately 2% film non-uniformity along with enhanced defect performance for the life of the processing kit. The results are achieved through the use of cathodes with targets approximately parallel to a wafer surface and with moving magnetic shields that prevent unwanted cathode interactions during film deposition. The embodiments permit, for example, RF magnesium oxide films to be manufactured on a high volume basis.

In some embodiments, a multiple cathode PVD chamber (e.g., process chamber 100) includes a plurality of cathodes 106 having a corresponding plurality of targets (at least one dielectric target 110 and at least one metallic target 112), (for example, 6 cathodes in a 3 RF×3 DC alternating configuration) attached to a chamber body 140 (for example, via a top adapter assembly 142). Other RF/DC cathode configurations can also be used such as 1×1, 2×2, 4×4, 5×5, etc. The numbers indicate a ratio of RF powered cathodes to DC powered cathodes. In some embodiments the RF and DC cathodes are alternated in the top adapter assembly 142. In other embodiments, an RF cathode can be adjacent to other RF cathodes and likewise for DC cathodes. In some embodiments, the ratio of RF cathodes to DC cathodes can be a non-equal ratio such as 1×2, 2×1, 1×3, 3×1, 2×3, etc. When multiple RF cathodes are used, the operating frequencies may be offset to reduce any interference during deposition processes. For example, in a three RF cathode configuration, the first RF cathode may be operated at a frequency of 13.56 MHz, the second RF cathode is operated at a frequency of 13.66 MHz (+100 kHz), and the third RF cathode is operated at a frequency of 13.46 MHz (−100 kHz). The offset is not required to be +/−100 kHz. The offset can be chosen based on cross-talk prevention for a given number of cathodes.

An RF cathode is typically used with the dielectric target 110 for dielectric film deposition on a wafer. A DC cathode is typically used with the metallic target 112 for pasting after the dielectric film deposition on the wafer. The pasting reduces the chance of particle formation and defects in the deposition film. Having a process chamber with RF and DC cathodes allows for faster production of wafers because the pasting and dielectric deposition can be done in one chamber. In addition, having multiple cathodes of the same type, allows for greater pasting and deposition rates. A greater deposition rate means that a wafer spends less time in the chamber to achieve a certain film thickness. The reduced time in the chamber or dwell time reduction results in fewer wafer defects.

In some embodiments, the metallic target 112 may be formed of a metal such as, for example, tantalum, aluminum, titanium, molybdenum, tungsten, and/or magnesium. The dielectric target 110 may be formed of a metal oxide such as, for example, titanium oxide, titanium magnesium oxide, and/or tantalum magnesium oxide. Other metals and/or metal oxides may be used.

The process chamber 100 also includes a substrate support 130 to support a substrate 132. The process chamber 100 includes an opening (not shown) (e.g., a slit valve) through which an end effector (not shown) may extend to place the substrate 132 onto lift pins (not shown) for lowering the substrate 132 onto a support surface 131 of the substrate support 130. In some embodiments as shown in FIG. 1, the targets 110, 112 are disposed substantially parallel with respect to the support surface 131. The substrate support 130 includes a biasing source 136 coupled to a bias electrode 138 disposed in the substrate support 130 via a matching network 134. The top adapter assembly 142 is coupled to an upper portion of the chamber body 140 of the process chamber 100 and is grounded. A cathode 106 can have a DC power source 108 or an RF power source 102 and an associated magnetron. In the case of the RF power source 102, the RF power source 102 is coupled to a cathode 106 via an RF matching network 104.

A shield 121 is rotatably coupled to the top adapter assembly 142 and is shared by the cathodes 106. In some embodiments, the shield 121 includes a shield body 122 and a shield top 120. In some embodiments, the shield 121 has aspects of the shield body 122 and the shield top 120 integrated into one unitary piece. In some embodiments, the shield 121 can be more than two pieces. Depending on the number of targets that need to be sputtered at the same time, the shield 121 can have one or more holes to expose a corresponding one or more targets. The shield 121 advantageously limits or eliminates cross-contamination between the plurality of targets 110,112. The shield 121 is rotationally coupled to the top adapter assembly 142 via a shaft 123. The shaft 123 is attached to the shield 121 via a coupler 119. Additionally, since the shield 121 is rotatable, areas of the shield 121 that would not normally receive pasting are moved such that the areas can now be pasted, significantly reducing flaking of built-up deposition and particle formation.

An actuator 116 is coupled to the shaft 123 opposite the shield 121. The actuator 116 is configured to rotate the shield 121, as indicated by arrow 144, and move the shield 121 up and down in the vertical direction along the central axis 146 of the process chamber 100, as indicated by arrow 145. During processing, the shield 121 is raised to an upward position. The raised position of the shield 121 exposes targets used during a processing step and also shields targets not used during the processing step. The raised position also grounds the shield for RF processing steps. The grounding of the shield 121 is discussed in more detail below with reference to FIGS. 6-8.

In some embodiments, the process chamber 100 further includes a process gas supply 128 to supply a process gas to an internal volume 125 of the process chamber 100. The process chamber 100 may also include an exhaust pump 124 fluidly coupled to the internal volume 125 to exhaust the process gas from the process chamber 100. In some embodiments, for example, the process gas supply 128 may supply oxygen to the internal volume 125 after the metallic target 112 has been sputtered. The inventors have observed that flowing oxygen into the process chamber 100 after the metallic paste advantageously reduces the sputter yield of the pasted metallic material because the sputter yield of a metallic oxide (e.g., tantalum oxide) is significantly less than that of the metal (e.g., tantalum). As a result, contamination of the substrate 132 is further reduced.

Figure 2:
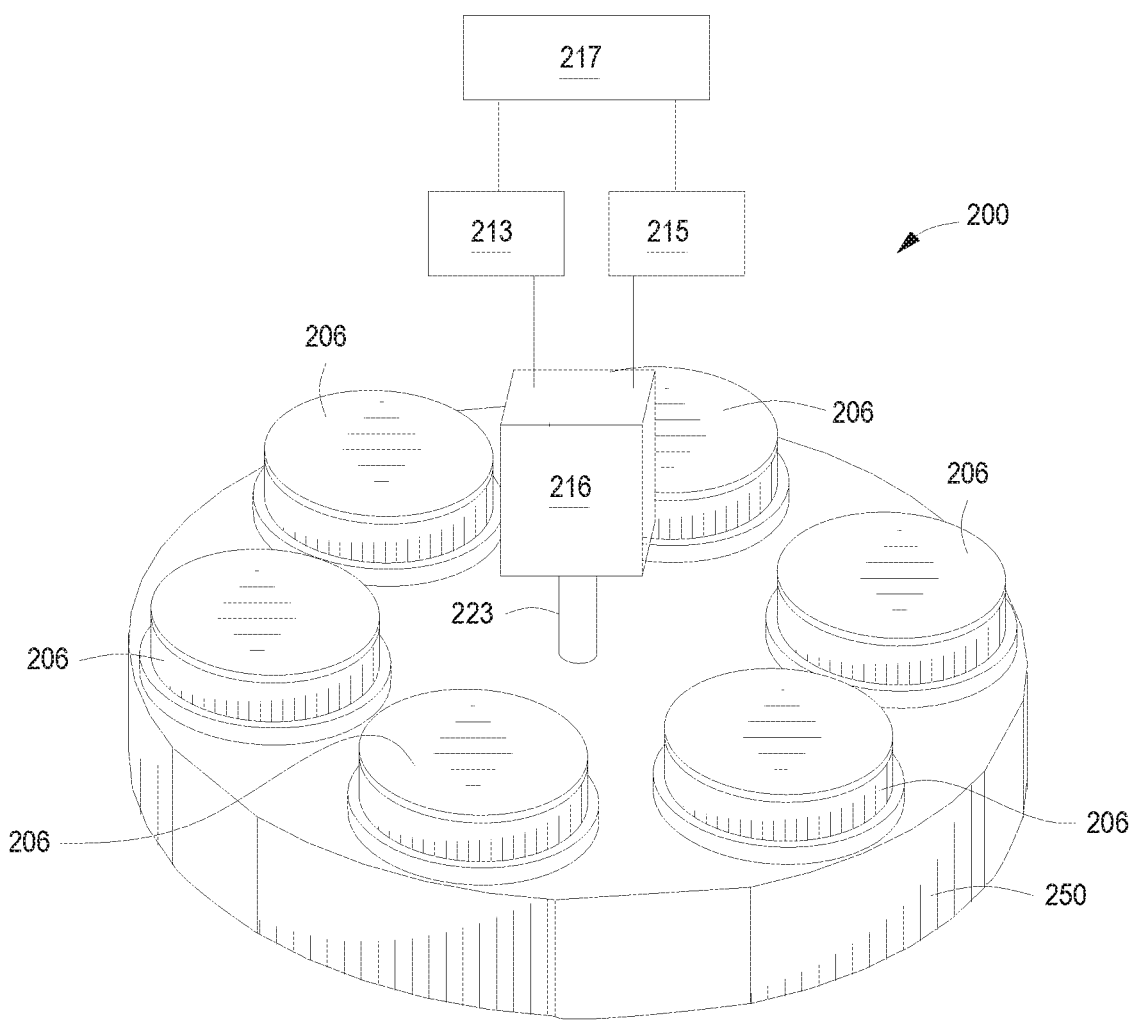
FIG. 2 depicts a top view of a top adapter assembly of the multiple cathode processing chamber of FIG. 1 in accordance with some embodiments of the present principles.

FIG. 2 depicts a top view of a top adapter assembly 200 in some embodiments of the process chamber 100 in FIG. 1. The top adapter assembly 200 includes an adapter 250, an actuator 216, and, for example, 6 cathodes 206. The top adapter assembly 200 can include more or less numbers of cathodes 206. The actuator 216 provides rotational movement and/or vertical movement of the shield 121 (as shown in FIG. 1). Although not depicted in FIG. 2, the actuator 216 can include multiple components such as a rotational component and a vertical motion component. In some embodiments, the rotational movement is provided by a motor (not shown) that rotates a shaft 223 which is coupled to the shield 121. In some embodiments the vertical movement is provided by a lift assembly (not shown). The lift assembly can include, for example, a linear actuator or slide with rails that lifts and lowers the shield 121 in the vertical or Z-axis direction. In some embodiments, the shield 121 can be raised and lowered approximately 0.8 inches in the Z-axis. The actuator 216 can be in signal communication with a rotation controller 213 that controls rotational movement of the shield 121. The actuator 216 can also be in signal communication with a vertical or Z-axis controller 215 that controls vertical movement of the shield 121. Either the rotation controller 213 or the Z-axis controller 215 or both can be in signal communication with a central controller or central server 217 that can be used to synchronize and/or calibrate the rotational and vertical movements of the shield 121. In some embodiments, sensors (not shown) can be used in conjunction with any of the controllers 213, 215, 217 or the actuator 216 to provide accurate control and placement of the shield 121. The sensors can provide control feedback and also permit tolerance adjustments on movements to compensate for wear and tear of components over their lifetime and/or to compensate for buildup of deposition materials on a surface of the shield 121.

With reference to FIG. 1, the process chamber 100 has cathodes 106 that are substantially parallel to and in close proximity of a processing cavity of the internal volume 125. In some embodiments of a multiple cathode configuration, such as a 3×3 configuration, half (three) of the cathodes are used during a given processing operation. Some of the advantages of using three cathodes during deposition include higher deposition rates which yield improved film quality and improved process kit life due to less buildup at a shield hole. The remaining cathodes of the 3×3 configuration are in an unused state during the deposition process. The inventors discovered that the unused cathodes radiate magnetic fields that influence the deposition process due to the cathodes' close proximities to the process cavity of the internal volume 125. In addition to interacting with the plasma, the magnetic fields were also found to potentially cause stray shield sputtering. The magnetic field interactions causes defects in and high non-uniformity of the deposition film. The inventors then created an apparatus that reduces the magnetic radiation from the unused cathodes and subsequently reduced the number and size of defects while increasing the uniformity of a deposition film. The advantages were achieved by reducing/eliminating the magnetic fields' effects on the plasma and sputtering. Different embodiments of the apparatus are discussed in more detail below.

Figure 3:
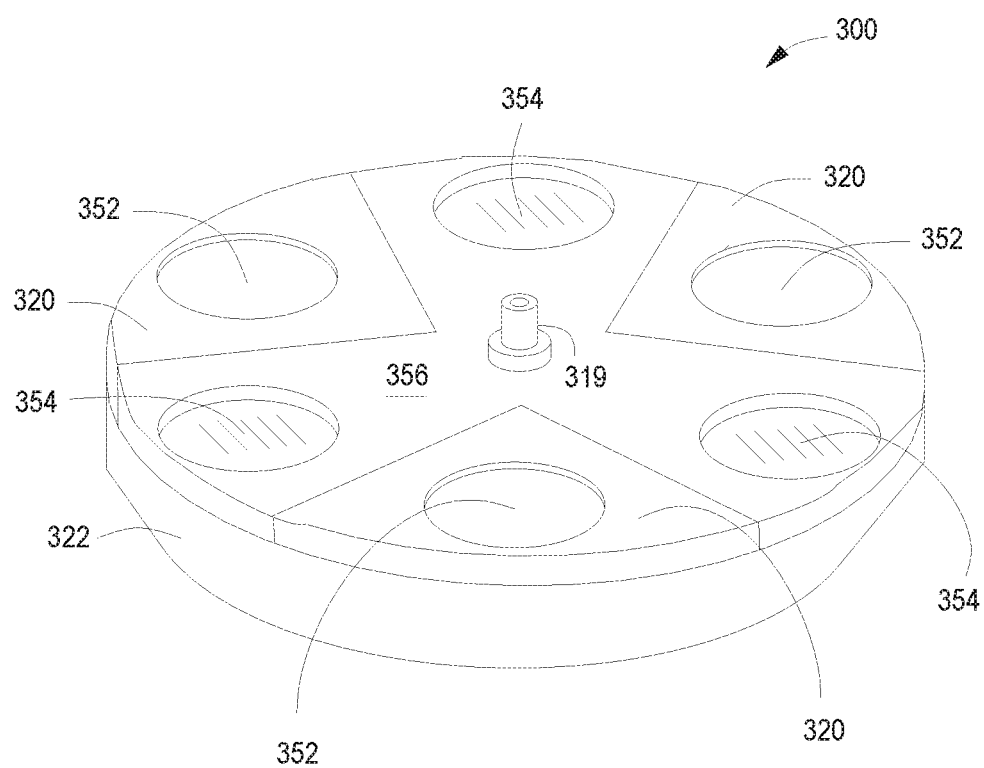
FIG. 3 depicts a view of a shield of a multiple cathode processing chamber in accordance with some embodiments of the present principles.

FIG. 3 depicts a view of a shield 300 of a multi-cathode processing chamber in accordance with some embodiments of the present principles. The shield 300 includes a shield body 322 and a shield top 320 with a mounting arm 356. The shield 300 can be replaced with other configurations (not shown in FIG. 3) such as, for example, 1×1, 2×2, 4×4, 5×5, 1×2, 1×3, 2×3, etc. In some embodiments the shield top 320 is integrated with the shield body 322 into a unitary piece. In other embodiments, the shield top 320 is discrete from the shield body 322 and may be independently separated from the shield body 322 for replacement. In some embodiments, the shield 300 can be more than two pieces. The shield top 322 has at least one hole 352 (three holes shown in FIG. 3) that allows at least one target to be exposed to the internal volume 125 of the process chamber 100 shown in FIG. 1. The mounting arm 356 includes at least one shunt 354 and a coupler 319. The mounting arm 356 engages with the shield top 320 to hold the shield 300 in place within the process chamber 100. The coupler 319 engages the shaft 123 of the actuator 116 of the top adapter assembly 142 to allow the shield 300 to rotate and move in the Z-axis. The mounting arm 356 can be a unitary part of the shield top 320 or the shield body 322. The mounting arm 356 can also be a discrete component as shown in FIG. 3. The shield 300 reduces particle formation by permitting at least a substantial portion of the shield 300 to be pasted.

The shunt 354 is formed from a material that inhibits magnetic radiation from permeating the internal volume 125. The material may be selected based on the material's magnetic permeability. In some embodiments a stainless steel variant such as, for example, 410 stainless steel can be used. In other embodiments, a material with a high magnetic permeability such as, for example, a nickel-iron alloy material can be used. An example of a commercially available nickel-iron alloy material is a material made from a Mu-metal variant. There are multiple companies that provide proprietary formulations of Mu-metal that can be used in some embodiments of the present principles. The number of shunts 354 can depend on the number of targets that are to be shielded during a processing step. In a 3×3 configuration (3 RF cathodes and 3 DC cathodes), three targets are shunted at a time during any given processing step. The mounting arm 356 for the 3×3 configuration shown in FIG. 3 has three shunts 354 that alternate with the holes 352 of the shield top 320. Other configurations of hole 352 and shunt 354 spacing can be found in other embodiments. The alternating pattern of holes 352 and shunts 354 illustrated in FIG. 3 are not required. In some embodiments, a shunt can be adjacent to another shunt. The shunt 354 may also be replaceable independent of the mounting arm 356. In some embodiments, replacing the shunt 354 may be desirable due to different configurations and/or different processes requiring different shunt materials, shunt sizes or shunt positions.

Figure 4:
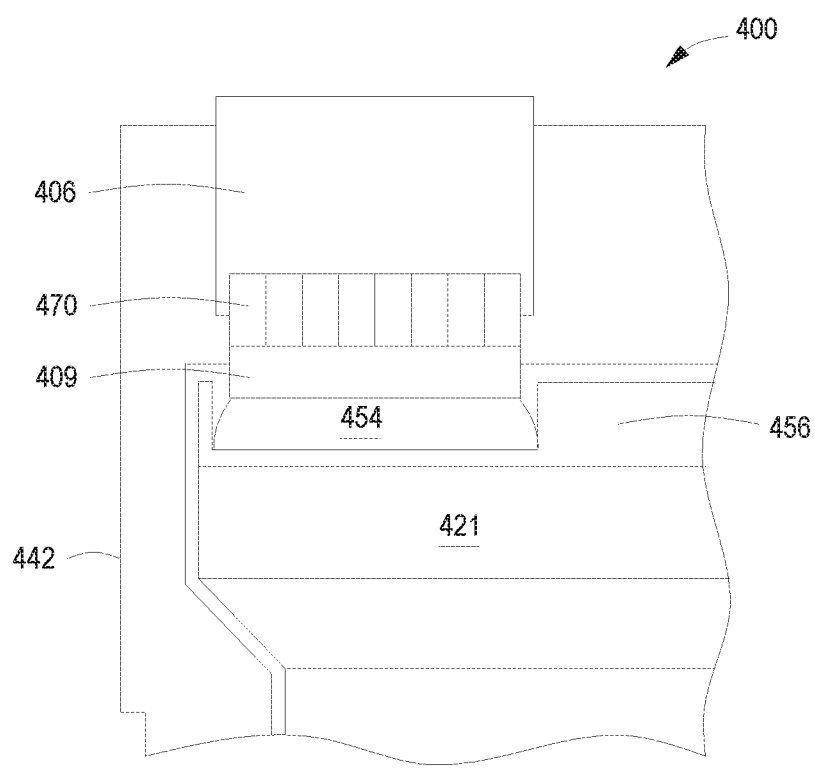
FIG. 4 depicts a partial schematic view of a process chamber with a shunt in proximity of a cathode in accordance with some embodiments of the present principles.

FIG. 4 illustrates a partial schematic view of a process chamber 400 with a shunt 454 in proximity of a cathode 406 in accordance with some embodiments of the present principles. The process chamber 400 includes a top adapter assembly 442 that houses the cathode 406 with a magnet 470 and a target 409. A shield 421 has been rotated and raised so that the shunt 454 in a mounting arm 456 is engaged with the target 409. The shunt 454 is now in a deposition processing position. The shunt 454 may or may not be fully in contact with the target 409 of the cathode 406. The shunt 454 size and position relative to the target significantly reduce magnetic radiation from the magnet 470 of the cathode 406. The size and position can be dependent on the material from which the shunt 454 is made as well as the strength of the magnetic field produced by the magnet 470. During deposition, the reduced magnetic fields within the internal volume 125 allow greater uniformity control during deposition. A Resistance Area (RA) non-uniformity (NU) number of less than approximately 2% can be obtained, with some embodiments achieving approximately 1.5% or less for the NU.

Figure 5:
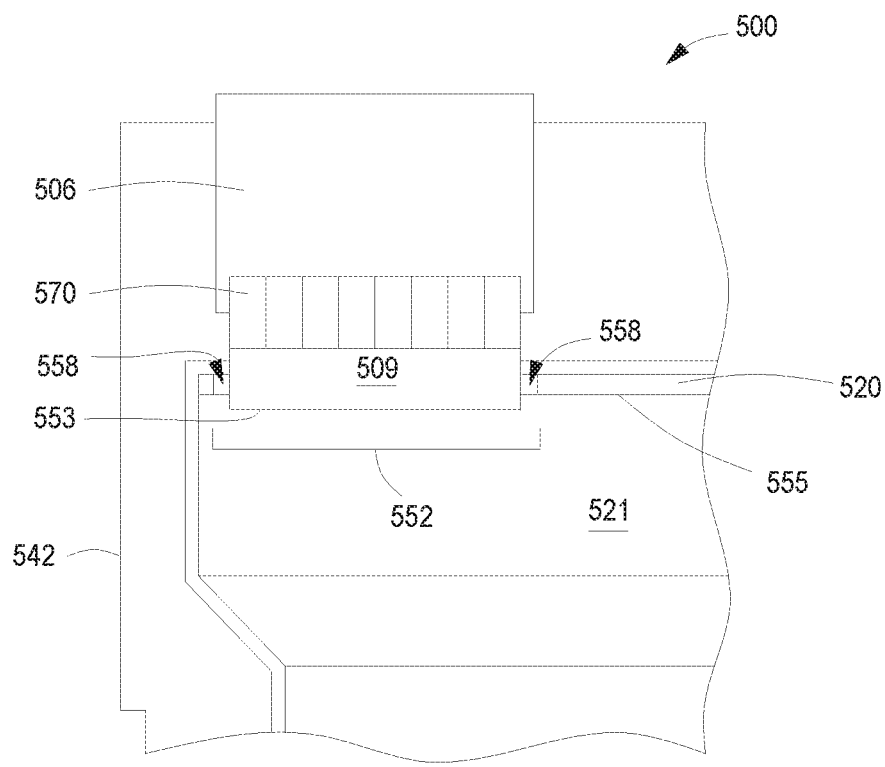
FIG. 5 depicts a partial schematic view of a process chamber with a shield hole in proximity of a cathode in accordance with some embodiments of the present principles.

FIG. 5 shows a partial schematic view of a process chamber 500 with a hole 552 from a shield 521 in proximity of a cathode 506 in accordance with some embodiments of the present principles. The process chamber 500 includes a top adapter assembly 542 that houses the cathode 506 with a magnet 570 and a target 509. The shield 521 has been rotated and raised so that the hole 552 in a shield top 520 is engaged with the target 509. The hole 552 is now in a deposition processing position that allows the target 509 to interact with plasma. The hole 552 envelopes the target 509 forming a gap 558 around the target 509. The gap 558 creates a dark space around the target 509 that keeps plasma from forming during deposition. The aspect ratio of the gap width to the gap height is kept at a value that inhibits spark formation and, thus, plasma formation. The aspect ratio can be adjusted, for example, by adjusting the thickness of the shield top 520, the amount of engagement of the hole 552 with the target 509, and the size of the hole 552. In some embodiments, the gap width can be approximately 60 thousandths to approximately 80 thousandths of an inch. The Z-axis movement of the shield 521 allows for accurate control of the formation of the dark space by controlling how far the target 509 protrudes into the hole 552. In FIG. 5, a bottom surface 555 of the shield top 520 has been raised beyond an internal volume surface 553 of the target 509. Other embodiments can limit the raising of the shield 521 such that the bottom surface 555 of the shield top 520 and the internal volume surface 553 of the target 509 are approximately co-planar.

Figure 6:
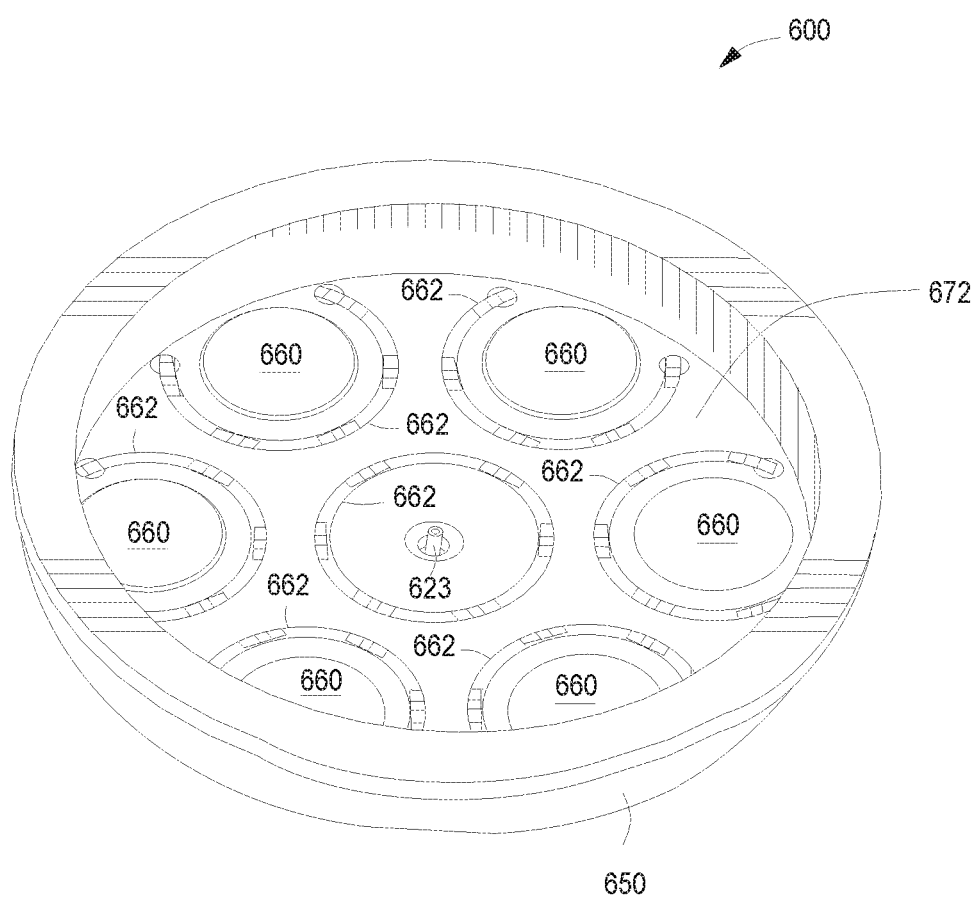
FIG. 6 depicts a bottom view of a top adapter assembly in accordance with some embodiments of the present principles.

In some embodiments, a process chamber 100 like the one shown in FIG. 1 may include a top adapter assembly 600 as shown in FIG. 6. An inner bottom surface 672 of an adapter 650 of the top adapter assembly 600 is illustrated. The top adapter assembly 600 includes a plurality of grounding loops 662 on the inner bottom surface 672. The grounding loops 662 provide improved grounding of the shield 121 to the top adapter assembly 142 of FIG. 1 when the shield is in the raised or processing position. The grounding loops 662 advantageously prevent the shield 121 from getting negatively charged by minimizing the energy between the plasma and the shield 121 when using RF power. As a result, the chances of the shield being sputtered are further reduced. The grounding loops 662 are positioned circumferentially to a plurality of targets 660 exposed on the inner bottom surface 672. Although FIG. 6 illustrates the grounding loops 662 as partially enclosing the targets 660, in other embodiments, the grounding loops 662 can fully enclose the targets 660 or even have less partial enclosure of the grounding loops 662. In some embodiments, grounding loops 662 are also positioned circumferentially around a shaft 623 for coupling with the shield 121. The number of grounding loops 662 can be one or more. For example, the grounding loops 662 may be limited to only the shaft 623. In some embodiments, the shaft 623 may be excluded and only the targets 660 may have grounding loops 662. In some embodiments, the grounding loops 662 can be placed in proximity of every other target.

Figure 7:
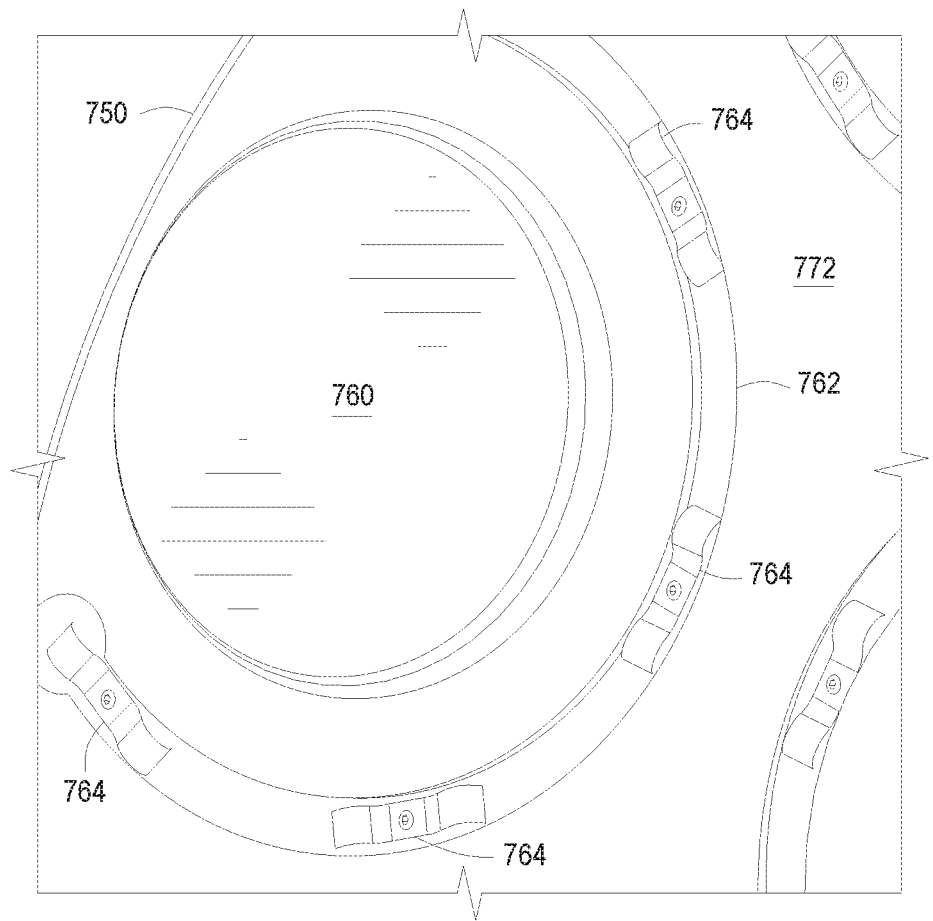
FIG. 7 depicts a portion of the bottom view of the top adapter assembly of FIG. 6 in accordance with some embodiments of the present principles.
Figure 8:
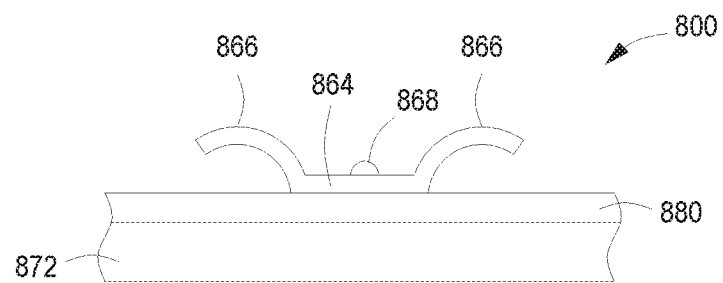
FIG. 8 depicts a schematic view of a contact point for a grounding loop for the top adapter assembly of FIG. 7 in accordance with some embodiments of the present principles.

FIG. 7 depicts a portion of a bottom view of a top adapter assembly 600 of FIG. 6 in accordance with some embodiments of the present principles. In some embodiments, a portion of a bottom surface 772 of an adapter 750 of the top adapter assembly 600 includes a grounding loop 762 with a plurality of contact points 764 circumferentially positioned in proximity of a target 760. The contact points 764 provide a compliant surface for engaging a shield. In FIG. 8, a schematic view of a contact point 800 for the grounding loop of FIG. 7 is shown. In some embodiments, the contact point 800 includes a contact body 864 with a plurality of compliant contact surfaces 866. When a rotatable shield is returned (raised) to a processing position, the top of the shield makes electrical contact with the compliant contact surfaces 866, resiliently deforming the contact body 864. The resilient deformation of the contact body 864 provides pressure against the top of a shield to ensure electrical continuity between a shield and an adapter for an RF return path. The contact body 864 has a fastening means 868 that maintains electrical engagement of the contact body 864 with a grounding loop trace 880 of a grounding loop. The fastening means 868 can include, for example, a screw, a bolt, conductive bonding material, a rivet, welding, soldering, and any other fastening techniques. The grounding loop trace 880 is in contact with a bottom surface 872 of an adapter.

While the foregoing is directed to embodiments of the present principles, other and further embodiments of the principles may be devised without departing from the basic scope thereof.

The invention claimed is:

1. A process chamber, comprising:
a chamber body defining an interior volume;
a substrate support to support a substrate within the interior volume;
a plurality of cathodes coupled to the chamber body and having a plurality of targets; and
a shield rotatably coupled to an upper portion of the chamber body and having at least one hole to expose at least one of the plurality of targets to be sputtered in a process and at least one magnetic field shunt disposed in a topside of the shield to accommodate and shield at least another one of the plurality of targets not to be sputtered in the process, wherein the shield is configured to rotate about and linearly move along a central axis of the process chamber and wherein the at least one magnetic field shunt is configured to decrease magnetic fields of a magnet above a target by engaging a top surface of the at least one magnetic field shunt with one of the plurality of targets when the shield is raised to an uppermost position in the interior volume.

2. The process chamber of claim 1, wherein the plurality of cathodes include three RF cathodes and three DC cathodes.

3. The process chamber of claim 1, wherein the plurality of targets is disposed parallel to the substrate support.

4. The process chamber of claim 3, wherein the plurality of targets includes six targets.

5. The process chamber of claim 4, wherein the six targets include three dielectric targets and three metallic targets.

6. The process chamber of claim 5, wherein the shield includes three non-adjacent holes.

7. The process chamber of claim 4, wherein the six targets include two adjacent dielectric targets, two adjacent first metallic targets formed of a first metal, and two adjacent second metallic targets formed of a second metal.

8. The process chamber of claim 7, wherein the shield includes at least two adjacent holes.

9. The process chamber of claim 1, further comprising:
a chamber body adapter coupled to an upper portion of the chamber body, wherein the chamber body adapter is grounded; and
at least one grounding trace on a lower surface of the chamber body adapter at least partially enclosing at least one of the plurality of targets, the at least one grounding trace has a plurality of contact bodies attached to the at least one grounding trace, each of the plurality of contact bodies has multiple compliant contact surfaces configured to make contact with and ground the shield to the chamber body adapter.

10. A process chamber, comprising:
a chamber body defining an interior volume;
a chamber body adapter coupled to an upper portion of the chamber body, wherein the chamber body adapter is grounded;
a substrate support to support a substrate within the interior volume;
a plurality of cathodes coupled the chamber body adapter and having a plurality of targets;
a shield rotatably coupled to the chamber body adapter and having at least one hole to expose at least one of the plurality of targets being sputtered in a process and at least one magnetic field shunt to accommodate and shield at least another one of the plurality of targets not being sputtered in the process, wherein the shield is configured to rotate about and linearly move along a central axis of the process chamber; and
at least one grounding trace on a lower surface of the chamber body adapter at least partially enclosing at least one of the plurality of targets, the at least one grounding trace has a plurality of contact bodies attached to the at least one grounding trace, each of the plurality of contact bodies has multiple compliant contact surfaces configured to make contact with and ground the shield to the chamber body adapter,
wherein the plurality of targets includes at least one dielectric target and at least one metallic target.

11. The process chamber of claim 10, wherein the plurality of targets is disposed parallel to the substrate support.

12. The process chamber of claim 11, wherein the plurality of targets includes six targets.

13. The process chamber of claim 12, wherein the six targets include three dielectric targets and three metallic targets.

14. The process chamber of claim 13, wherein the shield includes three non-adjacent holes.

15. The process chamber of claim 12, wherein the six targets include two adjacent dielectric targets, two adjacent first metallic targets formed of a first metal, and two adjacent second metallic targets formed of a second metal.

16. The process chamber of claim 15, wherein the shield includes two adjacent holes.

17. The process chamber of claim 10, wherein the magnetic field shunt is made of a material based on Mu-metal or 410 stainless steel.

18. An apparatus for processing substrates in a process chamber, comprising:
a shield configurable to be rotatably coupled to a chamber body of the process chamber, the shield having at least one hole to expose at least one of a plurality of targets to be sputtered and at least one magnetic field shunt to shield at least one of a plurality of targets not to be sputtered, wherein the shield is configurable to rotate about and linearly move along a central axis of the process chamber,
wherein the shield has a mounting arm with at least one radial extension embedded into a top of the shield, wherein a top surface of the mounting arm and a top surface of the shield are co-planar, wherein the at least one magnetic field shunt is located in a pocket of the at least one extension of the mounting arm and the at least one hole is located exterior of the at least one extension of the mounting arm in the top of the shield.

19. The apparatus of claim 18, wherein the shield has a mounting arm that supports the at least one magnetic field shunt.

20. The apparatus of claim 19, wherein the mounting arm is removable from the shield.

* * * * *

UNITED STATES PATENT AND TRADEMARK OFFICE
CERTIFICATE OF CORRECTION

PATENT NO. : 11,011,357 B2
APPLICATION NO. : 15/890694
DATED : May 18, 2021
INVENTOR(S) : Hanbing Wu Page 1 of 1

It is certified that error appears in the above-identified patent and that said Letters Patent is hereby corrected as shown below:

In the Claims

Column 10, in Claim 17, delete "410 stainless" and insert --stainless--

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*